(12) United States Patent
De Sandre et al.

(10) Patent No.: US 6,667,903 B2
(45) Date of Patent: Dec. 23, 2003

(54) PROGRAMMING METHOD FOR A MULTILEVEL MEMORY CELL

(75) Inventors: Guido De Sandre, Brugherio (IT); Marco Pasotti, S. Martino Sicc. (IT); Pier Luigi Rolandi, Monleale (IT); Giovani Guaitini, Trecella (IT); David Iezzi, Osnago (IT); Marco Poles, Ghedi (IT)

(73) Assignee: STMicroelectronics S.r.l., Agrate Brianza (IT)

(*) Notice: Subject to any disclaimer, the term of this patent is extended or adjusted under 35 U.S.C. 154(b) by 59 days.

(21) Appl. No.: 10/017,502

(22) Filed: Dec. 14, 2001

(65) Prior Publication Data
US 2002/0149963 A1 Oct. 17, 2002

(30) Foreign Application Priority Data
Dec. 15, 2000 (EP) .............................. 00830827

(51) Int. Cl.[7] .............................................. G11C 16/04
(52) U.S. Cl. ............................ 365/185.03; 365/185.18; 365/185.24
(58) Field of Search ........................ 365/185.03, 185.24, 365/185.28, 185.22, 185.18, 185.19, 45

(56) References Cited

U.S. PATENT DOCUMENTS

| | | | | |
|---|---|---|---|---|
| 5,717,632 A | * | 2/1998 | Richart et al. | 365/185.2 |
| 5,815,439 A | * | 9/1998 | Korsh et al. | 365/185.24 |
| 5,901,089 A | * | 5/1999 | Korsh et al. | 365/185.24 |
| 5,936,884 A | | 8/1999 | Hasbun et al. | 365/185.03 |
| 5,999,446 A | | 12/1999 | Harari et al. | 365/185.03 |
| 6,011,715 A | * | 1/2000 | Pasotti et al. | 365/185.03 |
| 6,064,597 A | | 5/2000 | Takeshima et al. | 365/185.24 |

* cited by examiner

Primary Examiner—Hoai Ho
Assistant Examiner—Gene N. Auduong
(74) Attorney, Agent, or Firm—Lisa K. Jorgenson; Robert Iannucci; Seed IP Law Group PLLC

(57) ABSTRACT

It is described a programming method for a multilevel memory cell able to store a plurality of bits in a plurality of levels. The method comprises the phases of: initially programming a cell threshold value to a first set of levels [0;(m-1)] being m a submultiple of the plurality of levels of the multilevel cell; reprogramming without erasing another set of levels [m;(2m-1)] containing the same number m of levels as the first set; reiterating the reprogramming without erasing phase until the levels of the multilevel cell are exhausted. It is also described a multilevel memory device of the type comprising a plurality of multilevel memory cells organized into sectors, the sectors being themselves split into a plurality of data units wherein a data updating operation is performed in parallel, the data units being programmed by means of the programming method.

22 Claims, 2 Drawing Sheets

PROGRAMMING METHOD FOR A MULTILEVEL MEMORY CELL

BACKGROUND OF THE INVENTION

1. Field of the Invention

This invention relates to a programming method for a multilevel memory cell able to store a plurality of bits in a plurality of levels.

The invention further relates to a multilevel memory device of the type comprising a plurality of multilevel memory cells.

The invention relates, particularly but not exclusively, to a Flash memory device, and the following description is made with reference to this application field with the only aim of simplifying its exposition.

2. Description of the Related Art

As it is well known in the field of Flash memories, the multilevel technique is widely accepted at present as a means to increase data density, with an equal physical density of the memory cells.

Known are in fact multilevel memory devices which can store plural logic values in a single memory cell. These devices are made in the form of integrated electronic circuits, which have achieved a sufficient degree of reliability to grant large scale production for several technical and commercial applications.

The market of semiconductor integrated electronic devices is showing great interest in multilevel memory devices because they afford information storage densities which are at least twice higher than those of two-level memory devices, either with the same technology and circuit area occupation.

The operation of such multilevel memory devices will now be briefly reviewed. The different programming state of a memory cell reflects in a different value of its threshold voltage Vth.

Of course, in the instance of a two-level cell, there would be only two values, corresponding to a logic 0 and a logic 1 state. In this case, the amount of information that can be stored results equal to one bit per cell.

On the other hand, a multilevel memory cell can store a larger number of bits than one. From the electrical standpoint, this means that there may be more than two possible threshold voltage values. The amount of information that can be stored in a single multilevel cell increases according to the following relation:

Number of bits per cell=$log_2$(number of values of Vth)

From the physical standpoint, the ability of altering the threshold voltage Vth, and therefore to program the multilevel memory cell, is granted by the floating gate design of the transistor which realizes the memory cell. The gate region is DC-isolated but can be accessed by charge injection processes of the Channel Hot Electrons and/or Fowler-Nordheim Tunneling Effect types.

When suitably controlled, these processes allow the amount of charge caught in the floating gate to be modulated, thereby allowing the effect of the latter on the threshold voltage value Vth to be changed.

The possibility of generating, in a large number of cells, a set of threshold voltage levels which can be distinguished upon reading is utilized to increase the density of the stored data.

However, the multilevel technique has inherently the disadvantage of slowing the processes of reading and programming each cell.

Also, there are applications—e.g. the implementation of a FAT memory for disk-on-silicon embodiments—which require the writing of small amounts of data, usually at non-contiguous addresses, for which the programming times are significantly longer.

In these applications, data updating requires that erasing/programming cycles be executed. In view of the time taken by such operations, two major problems stand out:

the updating time per bit becomes unacceptable whenever the amount of data to be updated is small; and an auxiliary memory is needed to store up data not to be updated, which data are nevertheless bound to become erased, since a whole sector would be erased at one time.

These problems make the use of current Flash memory architectures improposable.

Furthermore, power consumption is critical to such applications: all the energy used to store data which require no updating, and yet are affected by the erasing/programming process, is lost with respect to the updating operation.

Power usage is the more inefficient the smaller is the ratio between the data to be updated and the sector size.

The U.S. Pat. No. 5,936,884 granted on Aug. 10, 1999 in the name of Hasbun et al. describes a method for performing multiple writes before erasing a memory cell, using the multilevel technique, and hence the possibility of generating a set of threshold voltage levels in a large number of Flash cells, which voltage levels can be distinguished during a reading operation.

In particular, according to this known method, M bits are stored in a first group of levels of a multilevel memory cell and M superseding bits are stored in a second group of levels of the multilevel memory cell without erasing the cell itself. A group indicator is adjusted to identify a subsequent group of levels of the multilevel memory cell.

According to the known method described in the U.S. patent to Hasbun et al., the levels are "superimposed", i.e. the high level of a group is made to coincide with a low level of a subsequent group.

Thus, according to such a known solution, only N−1 levels of a total number N of levels are used to perform the reprogramming without erasing operations.

Moreover, to determine the value stored in a given multilevel memory cell, it is necessary to know what the last level written was, i.e. a tracking mechanism is needed. The group indicator described in the above cited U.S. patent provides for such a tracking mechanism to keep track of the current level or the proper reference voltage to use.

The degree of which tracking is performed (i.e. cell by cell, block, groups of blocks or device levels) is known as the tracking resolution.

The U.S. patent to Hasbun et al. states that a tracking mechanism implemented on a cell by cell basis might be inefficient. Moreover, when considering Flash memory devices, since all Flash cells within a block must be erased anyway, tracking might prove to be most efficient at the block or even the device level.

It should be noted that, contrary to what stated in such a known Patent, a group indicator on a block by block basis, or block indicator, increases the number of erasing executed for each cell. In fact, the bigger the block size, the greater the probability upon subsequent programming operations that the block indicator reaches the maximum value, thus requiring the sector, and hence the block, to be erased.

Even advantageous under various aspects, the above described known solution has a main drawback, connected to the tracking mechanism. In fact, the need of a tracking mechanism as a group indicator increases the complexity of the programming method for multilevel memory cells as well as of the corresponding multilevel memory device.

BRIEF SUMMARY OF THE INVENTION

An embodiment of the present invention is directed to a simplified method of programming Flash memory cells, which method has structural and functional features able to simplify the programming without erasing mechanism, thereby overcoming the drawbacks with which methods of programming memory devices, according to the prior art, are beset.

The simplified method performs multiple reprogramming without erasing and does not require a tracking mechanism to keep track of the current level being programmed.

In particular, the programming method for a multilevel memory cell able to store a plurality of bits in a plurality of levels, comprises the phases of:
- initially programming a cell threshold value to a first set of levels [0;(m−1)] being m a submultiple of the plurality of levels of the multilevel cell;
- reprogramming without erasing another set of levels [m;(2m−1)] containing the same number m of levels as the first set;
- reiterating the reprogramming without erasing phase until the levels of the multilevel cell are all exhausted.

Another embodiment of the present invention is directed a multilevel memory device comprising a memory array including a plurality of multilevel memory cells organized into sectors, the sectors being themselves split into a plurality of data units, a data updating operation being performed in parallel, wherein said data units are programmed by a programming method which comprises the phases of:
- initially programming a cell threshold value to a first set of levels [0;(m−1)] being m a submultiple of the plurality of levels of the multilevel cell;
- reprogramming without erasing another set of levels [m;(2m−1)] containing the same number m of levels as the first set;
- reiterating the reprogramming without erasing phase until the levels of the multilevel cell are all exhausted,
- wherein the maximum number of possible reprogrammings is univocally fixed by the threshold level of the cell.

A further embodiment is directed to a multilevel memory device comprising a memory array including a plurality of multilevel memory cells organized into sectors, the sectors being themselves split into a plurality of data units, a data updating operation being performed in parallel, further comprising at least a first sector and a second sector, which is an updated copy of the first one, both sectors being organized into data units programmed by a programming method which comprises the phases of:
- initially programming a cell threshold value to a first set of levels [0;(m−1)] being m a submultiple of the plurality of levels of the multilevel cell;
- reprogramming without erasing another set of levels [m;(2m−1)] containing the same number m of levels as the first set;
- reiterating the reprogramming without erasing phase until the levels of the multilevel cell are all exhausted,
- wherein the sectors are associated to a first programmed-unit counter and a second exhausted-unit counter, the first counter counting up each time that a first programming is effected in a data unit of the associated sector, and the second counter counting up upon any cell of a data unit of the associated sector reaching the maximum number of possible reprogrammings.

The features and advantages of the programming method and multilevel memory devices according to the invention will be apparent from the following description, of embodiments thereof, given by way of example and not of limitation with reference to the accompanying drawing.

DETAILED DESCRIPTION OF THE INVENTION

Figure 1:
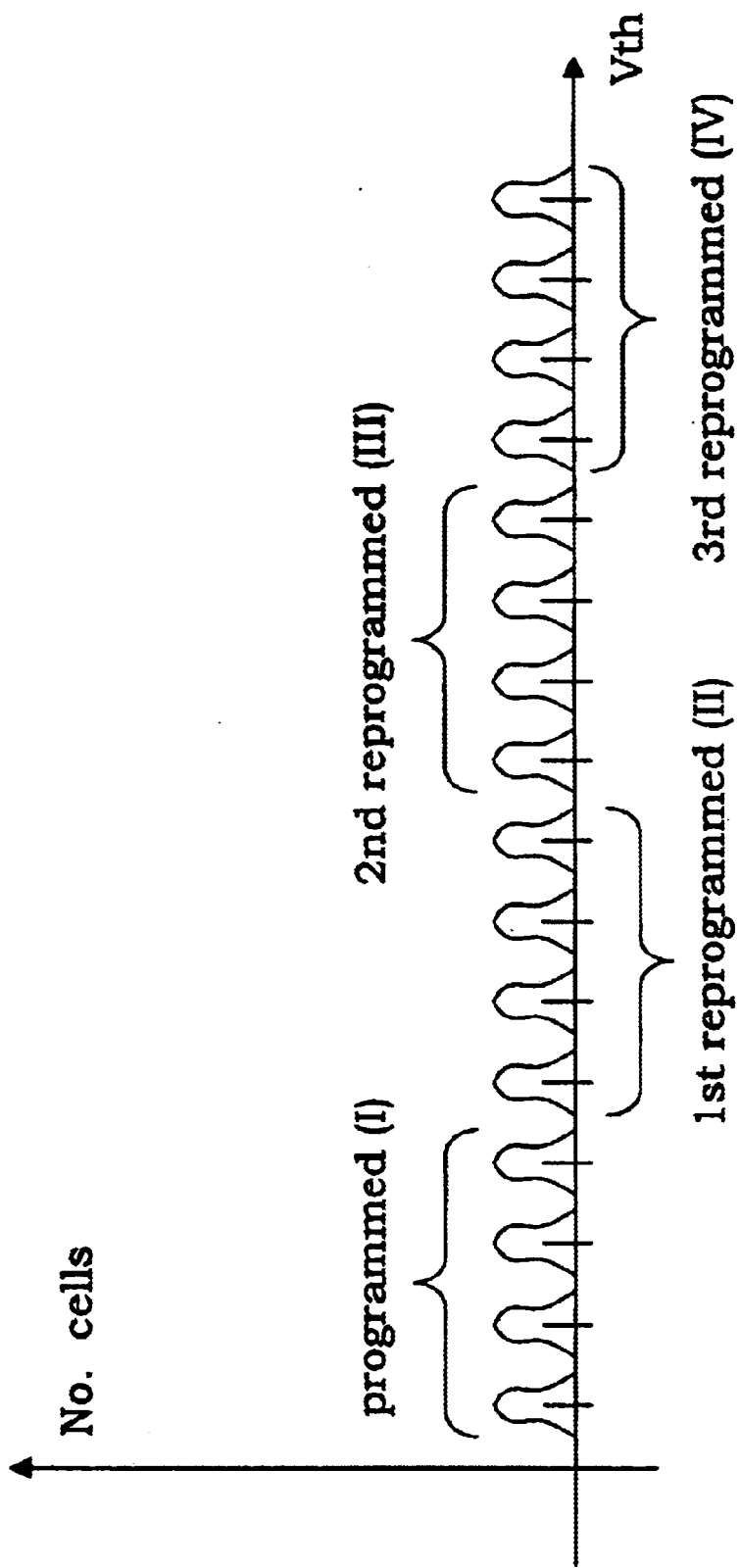
FIG. 1 schematically shows the operation of a programming method according to the invention.

With reference in particular to the only Figure, it is considered a programming through sixteen levels, being the equivalent of four bits per cell.

Advantageously according to an embodiment of the invention, two bits of each multilevel cell are programmed using the first four levels only. This leaves out twelve free levels, which remain available for three further reprogrammings of two bits per cell.

In particular, the first four levels are used to initially program (I) the cell, the following four levels to a first reprogramming without erasing (II), the next four levels to a second reprogramming without erasing (III), and the last four levels to a third reprogramming without erasing (IV).

In other words, a memory device using the method according to an embodiment of the present invention gives up two data density bits in favor of three reprogrammings without erasing.

Advantageously according to this embodiment of the present invention, the information in the reprogramming state is contained directly in the threshold level of the cell itself, no tracking mechanism for the level which has been programmed being required.

This programming method based on the multilevel technique can be extended in the manner explained here below.

Starting with a number nmax of bits per cell, and Nmax= $2^{nmax}$ of possible levels according to the multilevel technique, it is considered that n density bits are maintained, and $N_R$ is the number of reprogrammings without erasing.

This gives:

$$N_R = 2^{(nmax-n)} - 1$$

It is useful to express the number (N) of used levels in function of the number (n) of density bits and the number ($N_R$) of reprogrammings without erasing.

Table I below shows the levels required by the above reprogramming without erasing technique, in function of n and $N_R$.

TABLE I

| n/$N_R$ | 0 | 1 | 2 | 3 | 4 | 5 | 6 | 7 |
|---|---|---|---|---|---|---|---|---|
| 1 | 2 | 4 | 6 | 8 | 10 | 12 | 14 | 16 |
| 2 | 4 | 8 | 12 | 16 | 20 | 24 | | |
| 3 | 8 | 16 | 24 | | | | | |
| 4 | 16 | 32 | | | | | | |

The relation between the total number (N) of levels and the independent parameters n and $N_R$ is:

$$N = 2^n(N_R + 1)$$

In a preferred embodiment of the invention m levels are used to store bit values, where m can be equal or different from $2^n$. Having set independently the number of reprogrammings $N_R$, the total number N of available levels of the multilevel cell is:

$$N = m(N_R + 1)$$

Therefore, in such a preferred embodiment, the total number of available levels N is split into ($N_R$+1) groups, or sets, of m levels.

It should be noted here that the implementation of this reprogramming without erasing method using multilevel cells doesn't force any constraints on the layout of the memory sector containing said cells.

In particular, once the sector size is set, a unit of minimal size, and on which the data updating operation will be effected in parallel, may be defined as any integer number of cells (which is contained a whole number of times in that sector), down to only one cell, without any waste of area.

Before each programming, every cell in the unit is read, and the information contained in it allows a decision to be made as to the level at which the cells is to be reprogrammed, depending on the number of reprogrammings already effected, as schematically shown in the only Figure.

It is also evident that, as the decision can be taken on a cell by cell basis, not all the cells need to be reprogrammed to the subsequent group of levels. In particular, a reprogramming step should be applied only to the cells whose threshold voltage value should be increased in order to store a digital value, which is greater than the previously stored value.

To better understand the method according to an embodiment of the present invention, let's consider, by way of a non-limitative example, two bits per cell over 16 levels, and a cell which is programmed to a "1" value, for the first time, that is on group (I).

In order to program a "2" value it is sufficient to raise the threshold voltage value Vth of the cell to the next level. On the contrary, in order to program a "0" value it is necessary to raise the threshold voltage value Vth up to the first level of group (II).

In other words, the programming method according to an embodiment of the invention provides for a reprogramming of the multilevel cell by maintaining its threshold voltage value within a same set of m levels, whenever the value to be reprogrammed corresponds to a higher level than the previously stored one.

So, advantageously according to an embodiment of the present invention, the programming method comprises a step of reading the digital value contained in the multilevel memory cell before deciding to what level it has to be reprogrammed. In particular, the state of the multilevel cell is deduced by its threshold voltage value, thus determining if it is in the erased, programmed or reprogrammed state, as well as the number of reprogramming steps already performed on such a cell.

In case that all possible reprogrammings have been effected, a system is activated which allows the following operations to be carried out, while stopping the use of the memory for the shortest possible time:

restoring the sector to its original condition (erasing); and
restoring the data according to the last-effected updating (first programming).

Thus, unlike the prior art, the sector erasing and updating phase need only take place after all possible ($N_R$) reprogrammings are made, resulting in significantly reduced time and power consumption for the memory device considered.

Figure 2:
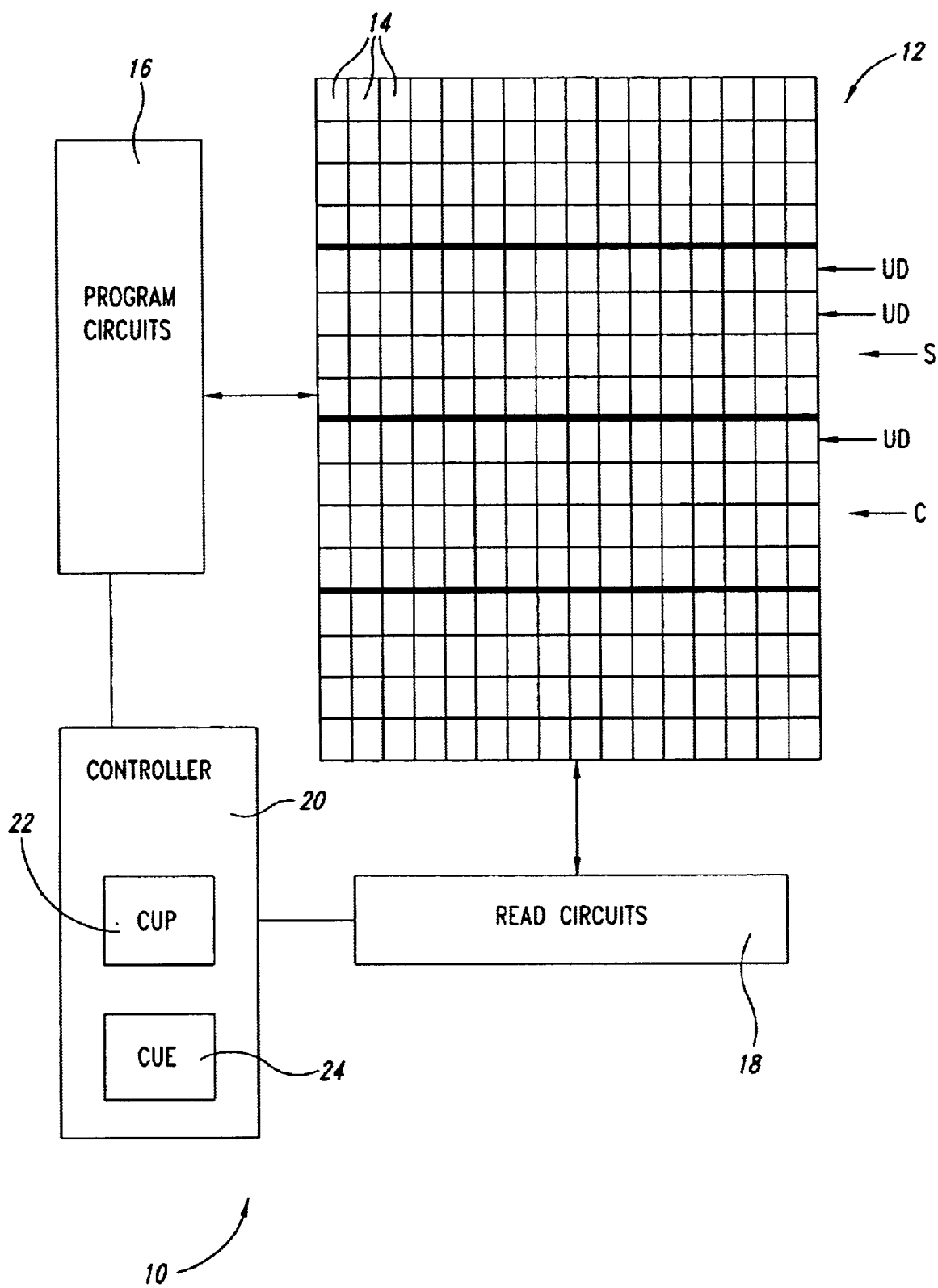
FIG. 2 schematically shows a multilevel memory device programmed and read according to an embodiment of the invention.

To make this programming method more clearly understood, a possible embodiment of a suitable multilevel memory device 10 to implement the proposed programming method will now be described with respect to FIG. 2 for the instance of n=2 and $N_R$=3, that is for two-bit programmings and three possible reprogrammnings without erasing.

The memory device 10 includes a memory array 12 of memory cells 14. A 16×16 memory array 12 is shown in FIG. 2 for simplicity only—the memory array 12 may include any number of memory cells 14. The memory device 10 also includes program circuits 16 for writing to and erasing the memory cells 14, read circuits 18 for reading from the memory cells 14, and a memory controller 20 for controlling the operation of the program and read circuits 16, 18. The program and read circuits 16, 18 can be known circuits, and thus, are not described further. The structure of the controller 20 can be easily appreciated in view of the functional description included herein.

In particular, the instance will be considered of two sectors, namely a sector S and a sector C, being used to store up the same data, with sector C being an updated copy of sector S. Thus, sector S will be programmed and/or reprogrammed first.

Assume data units UD to be contained in these sectors S and C, which units comprise 16 cells for the data.

Directly after the erase phase, the threshold voltage values (VthDATI) of those memory cells which contain the data of the sectors S and C are all at the 0 level, i.e. the first of the sixteen possible levels.

After the initial programming, the memory cells containing the data will have thresholds in the level range of 0 to 3, to indicate that no reprogrammings have been made.

During the next three reprogrammings, the threshold levels of the memory cells which contain the data will have, in the worst case, the values shown in Table II below.

TABLE II

| Number of reprogrammings | VthDATI |
|---|---|
| 1 | 4–7 |
| 2 | 8–11 |
| 3 | 12–15 |

Of course any cell can have a threshold voltage value lower than the above worst case values if the digital value to be reprogrammed is greater than the previously stored one, as discussed above.

In general, the value of the threshold levels will follow the Table IIb below

TABLE IIb

| Number of reprogrammings | VthDATI |
|---|---|
| 1 | $(2^n)–(2*2^n-1)$ |
| 2 | $(2*2^n)–(3*2^n-1)$ |
| 3 | $(3*2^n)–(4*2^n-1)$ | where,

VthDATI is a threshold voltage value of data cells of a data unit UD in the sectors S and C; .and n is the data bit density.

Assuming the memory device yields a 4 bit number for such a threshold voltage value, the first two bits indicate the group of levels (I, II, III, IV) while the last two bits indicate the stored value (0, 1, 2, 3).

The state of a cell in a data unit UD can be obtained by taking into consideration the threshold voltage values of the data-containing cells, as shown in Table III below.

TABLE III

| VthDATI | STATE |
|---|---|
| All 0 | Erased |
| 0–3 | Programmed |
| 4–7 | Reprogrammed I |
| 8–11 | Reprogrammed II |
| 12–15 | Reprogrammed III |

By reading the multilevel cell, and thus its threshold voltage value VthDATI, it is possible to deduce if such a cell is in the erased, programmed and reprogrammed (I, II and II) state.

Furthermore, a pair of counters is associated with either sectors S, C, namely: a programmed-unit counter (CUP) 22 and an exhausted-unit counter (CUE) 24. The former will count up each time that the first programming is effected on a data unit UD. The latter will count up as the threshold voltage (VthDATI) of any cell of a data unit UD is brought to level 12 or higher.

When any cell in a data unit UD of sector S has already undergone three reprogrammings and needs a further updating, sector C is brought into play.

A second phase is then started wherein all reprogrammings are made in the new sector.

As previously explained, the cells in the data unit UD in sector C are first read. For first programming, the value of the threshold voltage (VthDATI) of at least one cell in the corresponding data unit of sector S is brought to level 12 (if not already there). Accordingly, the exhausted-unit counter CUE counts up, while the data are programmed in sector C. For reprogramming, only sector C is acted upon.

In this second phase, the programmed unit counter CUP of sector S can no longer count up. As the exhausted-unit counter CUE of sector S reaches the same count as the programmed-unit counter CUP, sector S will no longer contain updated information, and its erasing can be started as a background operation with respect to the use processes the memory device containing sector S.

At this stage, sectors S and C reverse their roles, and the process goes back to the initial phase.

A data unit UD of sector C might be actually in need of the fourth reprogramming before sector S has been erased.

This event corresponds to a locked condition. Therefore, it becomes necessary to stop normal operation of the memory and update the contents of sector C by copying, from sector S, those data units UD which are still valid, and then erase sector S in order to program therein the data which could not be reprogrammed in sector C.

It is only at this point that the roles of sectors S and C can be reversed, and normal operation of the memory resumed as in the second programming phase.

The above locked condition may also occur after the erasing phase has already started. In this case, all that is required is to wait for the erasing to end in sector S, and to program the new data in sector S.

The proposed example, based on the use of two counters per sector and two sectors, is merely illustrative of the reprogramming without erasing method and in no way limitative of the invention applicability.

With reference to the known methods, the method according to the embodiments of the present invention allows a larger number of bits to be stored per unit area, especially where small-size data units UD are provided.

So, more levels have to be used for each reprogramming, but the information in the reprogramming state is contained directly in the threshold level of the cell itself, no tracking mechanism of the used level being required.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A programming method for a multilevel memory cell able to store a plurality of bits in a plurality of levels, comprising the phases of:

initially programming a cell threshold value to one of a first set of levels [0;(m−1)] being m a submultiple of the plurality of levels of the multilevel cell;

reprogramming the multilevel cell by maintaining its threshold voltage value within the first set of levels, whenever the value to be reprogrammed corresponds to a higher level than the previously stored one;

reprogramming without erasing another set of levels [m;(2m−1)] containing the same number m of levels as the first set;

reiterating the reprogramming without erasing phase until the levels of the multilevel cell are all exhausted.

2. The programming method of claim 1, wherein the total number of levels is function of the number m of levels in each of the sets available for reprogramming and the number of reprogrammings without erasing by the following relation:

$$\text{total number of level} = m(\text{number of reprogrammings} + 1).$$

3. The programming method of claim 1, wherein the total number of levels is function of the plurality of bits stored in the multilevel cell and the number of reprogrammings without erasing by the following relation:

$$\text{total number of level} = 2^{plurality\ of\ bits}(\text{number of reprogrammings} + 1).$$

4. The programming method of claim 1, further comprising the step of reading the multilevel cell before deciding to what level it has to be reprogrammed, the erased, programmed and reprogrammed state of the multilevel cell being deduced by its threshold voltage value.

5. The programming method of claim 1, further comprising a further phase of restoring the multilevel memory cell to an initial condition.

6. The programming method of claim 5, wherein said phase of restoring to an initial condition comprises a data restoring phase consistent with the initial programming.

7. The programming method of claim 5, wherein said phase of restoring to an initial condition comprises a phase of erasing a memory sector where the cell is located.

8. A multilevel memory device comprising
a memory array including a plurality of multilevel memory cells organized into sectors, the sectors being themselves split into a plurality of data units of memory cells; and
means for performing a data updating operation in parallel, wherein the means for performing include means for:
initially programming threshold values of the cells of a selected one of the data units to a first set of levels [0;(m−1)] being m a submultiple of the plurality of levels of the multilevel cell;
reprogramming the cells of the selected data unit without erasing another set of levels [m;(2m−1)] containing the same number m of levels as the first set, said reprogramming in response to a determination that a level to be written has a magnitude less than a level previously written to the first set of levels; and
reiterating the reprogramming without erasing phase until the levels of the cells of the selected data unit are all exhausted, wherein the maximum number of possible reprogrammings is univocally fixed by a threshold level of the cells.

9. The multilevel memory device of claim 8, further comprising a first sector, and a second sector which is an updated copy of the first sector, both sectors being organized into data units, and in that said initial programming phase is applied to said first sector.

10. The multilevel memory device of claim 9, wherein the reprogramming phases modify threshold voltage values of the memory cells according, in the worst case, to the following table:

| Number of reprogrammings | VthDATI |
|---|---|
| 1 | $(2^n)-(2*2^n-1)$ |
| 2 | $(2*2^n)-(3*2^n-1)$ |
| 3 | $(3*2^n)-(4*2^n-1)$ | where,
VthDATI is a threshold voltage value of data cells of a data unit in the sectors; and
n is the data bit density.

11. A multilevel memory device comprising
a memory array including a plurality of multilevel memory cells organized into sectors, the sectors being themselves split into a plurality of data units, the sectors including
a first sector and a second sector, which is an updated copy of the first sector;
means for performing a data updating operation in parallel, the means including means for:
initially programming a cell threshold value to a first set of levels [0;(m−1)] being m a submultiple of the plurality of levels of the multilevel cell;
reprogramming without erasing another set of levels [m;(2m−1)] containing the same number m of levels as the first set; and
reiterating the reprogramming without erasing phase until the levels of the multilevel cell are all exhausted; and
a first counter and a second exhausted-unit counter, the first counter counting up each time that a first programming is effected in a data unit of the associated sector, and the second counter counting up upon any cell of a data unit of the associated sector reaching the maximum number of possible reprogrammings.

12. The multilevel memory device of claim 11, wherein said programming/reprogramming phases are carried out in the second sector, starting from the moment that a reprogramming phase affects a data unit of the first sector (S) which has reached the maximum number of possible reprogrammings, and conversely, wherein the programming/reprogramming phases are carried out in the first sector, starting from when, having been the roles of the first sector and the second sector exchanged after erasing sector, a reprogramming phase affects a data unit of the second sector which has reached the maximum number of possible reprogrammings.

13. The multilevel memory device of claim 11, further providing a phase of erasing one sector upon the second exhausted-unit counter associated with said sector reaching the same count as the first programmed-unit counter.

14. The multilevel memory device of claim 13, further providing a phase of locking out the normal usage of the memory device to update the contents of the second sector by copying those data units which are still valid from the first sector, followed by a phase of erasing the first sector, and a phase of programming data in the first sector, said locking phase being applied whenever a data unit of the second sector needs a larger number of reprogrammings than the maximum number before the phase of erasing the first sector.

15. A programming method for a multilevel memory cell able to store a plurality of bits in a plurality of levels, comprising the phases of:
selecting a first set of levels [0;(m−1)] being m a submultiple of the plurality of levels of the multilevel cell
initially programming a cell threshold value to the first set;
selecting a second set of levels [m;(2m−1)] containing the same number m of levels as the first set
reprogramming without erasing the second set;
reiterating the selecting and reprogramming without erasing phases;
selecting a last set of levels containing the same number m of levels as the first set and achieving the selection of the total number of levels of the multilevel cell; and
reprogramming without erasing the last set.

16. The programming method of claim 15, wherein the total number of levels is function of the number m of levels in each of the selected sets and the number of the reprogramming without erasing phases by the following relation:

total number of level=$m$(number of the reprogramming without erasing phases+1).

17. The programming method of claim 15, wherein the total number of levels is function of the plurality of bits stored in the multilevel cell and the number of the reprogramming without erasing phases by the following relation:

total number of level=$2^{plurality\ of\ bits}$(number of the reprogramming without erasing phases+1).

18. The programming method of claim 15, further comprising the phases of:
reading the multilevel cell;

determining the threshold voltage value of the multilevel cell;

evaluating the state of the multilevel cell by the threshold voltage value choosing the level of the multilevel cell to be reprogrammed starting from the state of the multilevel cell.

19. The programming method of claim 15, further comprising the step of reprogramming a multilevel cell by maintaining its threshold voltage value within a same of the set of levels, whenever the value to be reprogrammed corresponds to a higher level than the previously stored one.

20. The programming method of claim 15, further comprising a further phase of restoring the multilevel memory cell to an initial condition.

21. The programming method of claim 20, wherein said phase of restoring to an initial condition comprises a phase of erasing a memory sector where the cell is located.

22. The programming method of claim 20, wherein said phase of restoring to an initial condition comprises a data restoring phase consistent with the initial programming.

* * * * *